United States Patent
Iwane et al.

(10) Patent No.: US 7,393,754 B2
(45) Date of Patent: Jul. 1, 2008

(54) TAPE CARRIER TYPE SEMICONDUCTOR DEVICE AND METHOD OF PRODUCING THE SAME

(75) Inventors: Tomohiko Iwane, Nara (JP); Keiichi Inomo, Asaguchi gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 329 days.

(21) Appl. No.: 10/870,941

(22) Filed: Jun. 21, 2004

(65) Prior Publication Data
US 2004/0256702 A1 Dec. 23, 2004

(30) Foreign Application Priority Data
Jun. 19, 2003 (JP) .............................. 2003-175096

(51) Int. Cl.
*H01L 21/60* (2006.01)
(52) U.S. Cl. .................... 438/401; 438/15; 257/48; 257/668; 257/797; 257/E23.179
(58) Field of Classification Search ............... 438/15, 438/401; 257/668, 48
See application file for complete search history.

(56) References Cited
U.S. PATENT DOCUMENTS
5,729,315 A * 3/1998 Takahashi et al. .......... 349/149
5,841,188 A * 11/1998 Murasawa ................. 257/668
6,523,446 B1 * 2/2003 Tanabe et al. .............. 83/371
6,788,091 B1 * 9/2004 Weber ....................... 324/765
6,953,989 B2 * 10/2005 Kiriyama ................... 257/668

FOREIGN PATENT DOCUMENTS

| JP | SHO 630288038 | | 11/1988 |
|---|---|---|---|
| JP | 02-271545 | | 11/1990 |
| JP | 03104249 A | * | 5/1991 |
| JP | 03104252 A | * | 5/1991 |
| JP | 05021536 A | * | 1/1993 |

* cited by examiner

*Primary Examiner*—Jerome Jackson
*Assistant Examiner*—José R. Díaz
(74) *Attorney, Agent, or Firm*—Nixon & Vanderhye P.C.

(57) ABSTRACT

A tape carrier type semiconductor device comprising: a long flexible insulating tape; and a plurality of semiconductor devices sequentially arranged on one surface of the tape, wherein each semiconductor device has a wiring pattern and a semiconductor element, and wherein each semiconductor device has either a hole or a target mark inside a predetermined region enclosed by an outline of the semiconductor device, the outline being for die-cutting into pieces, the hole being bored through the tape for indicating that the semiconductor device is a non-defective, the target mark not being bored through the tape for indicating that the semiconductor device is a defective.

2 Claims, 4 Drawing Sheets

PRIOR ART

PRIOR ART

US 7,393,754 B2

TAPE CARRIER TYPE SEMICONDUCTOR DEVICE AND METHOD OF PRODUCING THE SAME

CROSS-REFERENCE TO RELATED APPLICATION

This application is related to Japanese application No. 2003-175096 filed on Jun. 19, 2003, whose priority is claimed under 35 USC § 119, the disclosure of which is incorporated by reference in its entirety.

BACKGROUND OF THE INVENTION

1. Field of the Invention

The present invention relates to a tape carrier type semiconductor device, and more particularly, to a tape carrier type semiconductor device called a COF (chip on a flexible printed circuit) comprising a long flexible insulating tape and a plurality of semiconductor devices sequentially arranged on one surface of the tape, each semiconductor device having a wiring pattern and a semiconductor element.

2. Description of Related Art

COFs in the form of pieces are incorporated into a panel of a portable phone, a PDA (personal digital assistance), a notebook PC, a liquid crystal TV or the like. COFs in the form of long tapes have a structure where a plurality of semiconductor elements are sequentially mounted at equal distances on the same surface of a long flexible insulating tape (tape carrier) that has a plurality of predetermined metal wiring patterns thereon.

Examples of a method of mounting the semiconductor elements on the tape carrier include thermocompression bonding by heating a part of each wiring pattern called an inner lead provided on the tape carrier and an electrode of each semiconductor element from a surface of the tape carrier opposite to the wiring pattern and applying a pressure from the surface of the tape carrier opposite to the wiring pattern.

After mounting the semiconductor elements, a resin is injected into the interface between the tape carrier and the semiconductor elements and cured to protect surfaces of the semiconductor elements. Then, a non-defective/defective determination test is conducted by a tester for exclusive use while standing a probe needle in an external output terminal called an outer lead provided on the tape carrier.

By this test, it is determined whether each of COFs (semiconductor devices arranged on the tape carrier) is a non-defective or a defective.

As shown in FIG. 3, for a COF determined to be a non-defective, a hole 8 for indicating that the COF is a non-defective is bored out with a die through the tape carrier outside a predetermined region enclosed by an outline 6 of the COF.

Then, using a specific device, each COF is identified as a non-defective or a defective by the presence or absence of the hole 8. For a defective having no hole 8, a hole 9 is punched out with another die to remove a portion having a semiconductor element 2 at the center, as shown in FIG. 3. Then, the resulting COF in the form of a long tape undergoes a final inspection and is shipped in a reeled state to the user.

After receiving the COF in the form of a long tape, the user die-cuts it with a die sequentially along the outlines 6 into COFs in the form of pieces separate from one another, as shown in FIG. 4.

Since the COFs in the form of pieces into which the COF in the form of a long tape has been die-cut sequentially along the outlines 6 cannot be identified as a non-defective or a defective by the presence or absence of the hole 8 shown in FIG. 3, it is identified as a non-defective or a defective by whether the portion having the semiconductor element 2 at the center is removed or not (as shown in FIG. 4, for a defective, the hole 9 is punched out therein to remove the portion having the semiconductor element 2 at the center, whereas for a non-defective, the hole 9 is not punched out therein). Thereafter, only COFs identified as non-defectives are mounted and put into commercial production.

Examples of a method of identifying an integrated circuit (IC) as a non-defective or a defective include one described in Japanese Unexamined Patent Publication No. 63(1988)-288038.

The following is the gist of a "tape carrier" disclosed in Japanese Unexamined Patent Publication No. 63(1988)-288038.

The disclosed tape carrier is aimed to prevent the erroneous recognition of detection using a photo sensor by forming light-shielding pads on parts of an insulating film whereon there exists no metal wiring pattern and boring a hole in the parts whereon there exists no metal wiring pattern so that the hole penetrates the insulating film.

More specifically, an IC metal pad 8 is provided and a through hole 9a is bored therein. A pad free from errors of detection has a size of 2 mm×2 mm or more in square when the hole has a diameter of 1 mm. Moreover, a hole like 9b may be bored in a part of a wiring pattern. In this case, pads 6 may have a largish size and an electric test may be conducted even after the hole is bored in the pads. In a case where the color of an insulating film 1 is relatively deep, not the whole periphery of the hole but only a part thereof may be covered with a metal.

With the above construction, a detection using a photo sensor can be executed with a high reliability on the basis of the presence or absence of the hole in the carrier tape so that a mistake that a non-detective is removed or a defective is handled as a non-defective is eliminated.

According to the above publication, after an IC is identified as a non-defective or a defective, a hole is bored through the tape carrier outside or inside a region enclosed by an outline of a COF arranged on the tape carrier, and then the COF arranged on the tape carrier is identified as a non-defective or a defective by the presence or absence of the hole.

Meanwhile, the aforementioned COF in the form of a long tape is shipped in a state that the holes 9 are punched out with the die in defectives to remove the portions each having the semiconductor element 2 at the center, as described above. The die is of a size large enough to be allowed for shared use and to be adapted to change to a certain degree in size of the semiconductor element 2.

The COFs in the form of long tapes received by the user are transferred reel to reel to be die-cut with the die sequentially along the outlines 6 into COFs in pieces. At this time, in the case where a COF in the form of a thin tape (generally having a thickness of 40 μm or less) is provided with large holes 9 sequentially punched out therein to remove large portions, deformation could be caused in the tape to make the transfer of the tape unstable and thereby the risk of failure in the die-cutting into pieces could be raised.

Further, once the COF in the form of a long tape is die-cut along the outlines 6 into pieces, each COF in the form of a piece cannot be identified as a non-defective by the presence or absence of the hole 8 shown in FIG. 3.

On the other hand, the "tape carrier" disclosed in Japanese Unexamined Patent Publication No. 63(1988)-288038 where detection is made by a photo sensor needs special devices including the photo sensor.

SUMMARY OF THE INVENTION

The present invention has been made under these circumstances, and its object is to provide a tape carrier type semiconductor device which is capable of reducing the risk of failure in die-cutting into pieces and which is capable of easily identifying each piece as a non-defective or a defective only through visual observation regardless of whether the identification is made before or after the die-cutting into pieces.

In one aspect, the present invention provides a tape carrier type semiconductor device comprising: a long flexible insulating tape; and a plurality of semiconductor devices sequentially arranged on one surface of the tape, wherein each semiconductor device has a wiring pattern and a semiconductor element, and wherein each semiconductor device has either a hole or a target mark inside a predetermined region enclosed by an outline of the semiconductor device, the outline being for die-cutting into pieces, the hole being bored through the tape for indicating that the semiconductor device is a non-defective, the target mark not being bored through the tape for indicating that the semiconductor device is a defective.

The predetermined region enclosed by an outline of the semiconductor device refers to a region enclosed by a die-cutting outline of each of semiconductor devices in the form of pieces into which the tape is die-cut with a die.

Each semiconductor device has either the hole or the target mark inside the predetermined region enclosed by an outline of each semiconductor device. The former is bored through the tape and is for indicating that the semiconductor device is a non-defective. The latter is not bored through the tape and is for indicating that the semiconductor device is a defective.

In another aspect, the present invention provides a method of producing a tape carrier type semiconductor device, comprising the steps of: arranging a plurality of semiconductor devices sequentially on one surface of a long flexible insulating tape; forming either a hole or a target mark inside a predetermined region enclosed by an outline of each semiconductor device, the outline being for die-cutting into pieces, the hole being bored through the tape for indicating that the semiconductor device is a non-defective, the target mark not being bored through the tape for indicating that the semiconductor device is a defective; and conducting a test using a tester to determine sequentially whether each of the plurality of semiconductor devices arranged on the surface is a non-defective or a defective.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
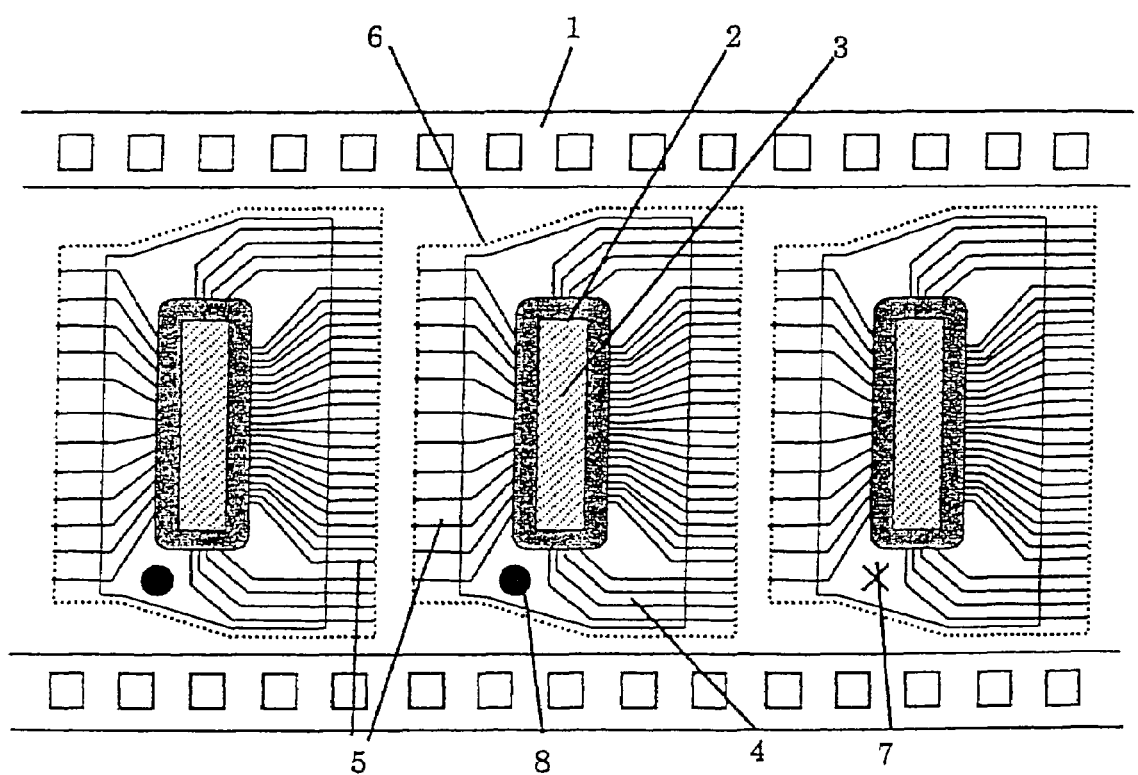
FIG. 1 is a plan view illustrating a state of a tape carrier type semiconductor device of the present invention (wherein two non-defectives are arranged on the left and one defective is arranged on the right before die-cutting into pieces.

According to the tape carrier type semiconductor device of the present invention, unlike prior art tape carrier type semiconductor devices, the large holes to remove large portions each having the semiconductor element at the center are not punched out. The large holes could cause deformation in the semiconductor device to make the transfer of the tape unstable and thereby could cause failure in die-cutting into pieces. Therefore, according to the tape carrier type semiconductor device of the present invention where the large holes are absent, it is possible to prevent failure in die-cutting into pieces.

Also, according to the tape carrier type semiconductor device of the present invention, each semiconductor device arranged on the tape has, inside the predetermined region enclosed by the outline of the semiconductor device, either the hole for indicating that the semiconductor device is a non-defective or the target mark for indicating that the semiconductor device is a defective. Therefore, it is possible to easily identify each piece as a non-defective or a defective only through visual observation regardless of whether the identification is made before or after the die-cutting into pieces without using special devices including a photo sensor as employed in prior art tape carrier semiconductor devices.

In the present invention, the reason why the hole is bored through the tape whereas the target mark is not bored through the tape is to overcome the inconvenience that a semiconductor device which should be handled as a non-defective is determined to be a defective for poor connection of a probe needle in the non-defective/defective determination test by a tester for exclusive use.

According to the present invention, the determination test is renewed through, for example, a retest for checking to bring back the semiconductor device, and the hole for indicating that the semiconductor device is a non-defective is bored. Therefore, according to the present invention, the need for boring the hole to remove the large portion having the semiconductor element at the center can be eliminated to thereby reduce the number of operations by one operation.

The insulating tape of the tape carrier type semiconductor device according to the present invention may be a polyimide-based tape. It preferably has a thickness of 5 μm to 40 μm. A thickness of less than 5 μm is not preferable because the tape fails to have a sufficient strength. A thickness of more than 40 μm is not preferable because the transferability of the tape in its production processes is lowered and the costs increase.

The hole for indicting that a semiconductor device is a non-defective may be round and have a diameter of 0.5 mm to 3.0 mm. A diameter of less than 0.5 mm is not preferable, because it is difficult to judge whether a semiconductor device has a hole through it or a flaw. A diameter of more than 3.0 mm is not preferable because a trouble may be caused in deciding where the hole should be bored inside the predetermined region enclosed by the outline of a semiconductor device.

Simultaneously with the formation of the wiring patterns, the target mark is formed with use of a copper foil inside the predetermined region enclosed by the outline of a semiconductor device. The target mark is subjected to a plating treatment in the same manner as the wiring pattern. The target mark may have a size of 0.5 mm×0.5 mm to 3.0 mm×3.0 mm.

The target mark preferably has a surface plated with tin or gold for the reason as follows. That is, on the fact that a polyimide-based tape is of a yellowish brown color, the target mark of a copper foil color is difficult to distinguish from the tape because the copper foil color is close to the yellowish brown color, whereas the target mark with a tin- or gold-plated surface is easy to distinguish. Also, in the case where a semiconductor device arranged on the tape is a non-defective, the hole is bored through the tape at the target mark so that it can be clearly discerned even through visual observation that the semiconductor device is a non-defective.

The target mark which, in the following embodiment, is a × mark may be any such as a + mark, a square mark, a round mark or the like.

The present invention will now be explained in detail based on the preferred embodiment shown in the drawings. It should be understood that the present invention is not limited to the embodiment.

Figure 2:
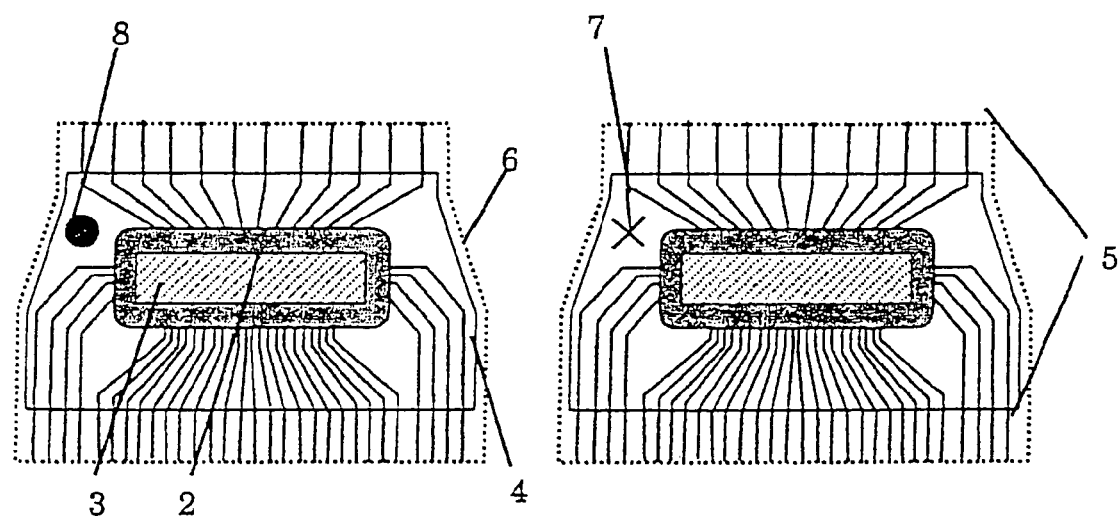
FIG. 2 is a plan view illustrating a state of the tape carrier type semiconductor device of the present invention (wherein a non-defective is arranged on the left and a defective is arranged on the right after die-cutting into pieces.
Figure 3:
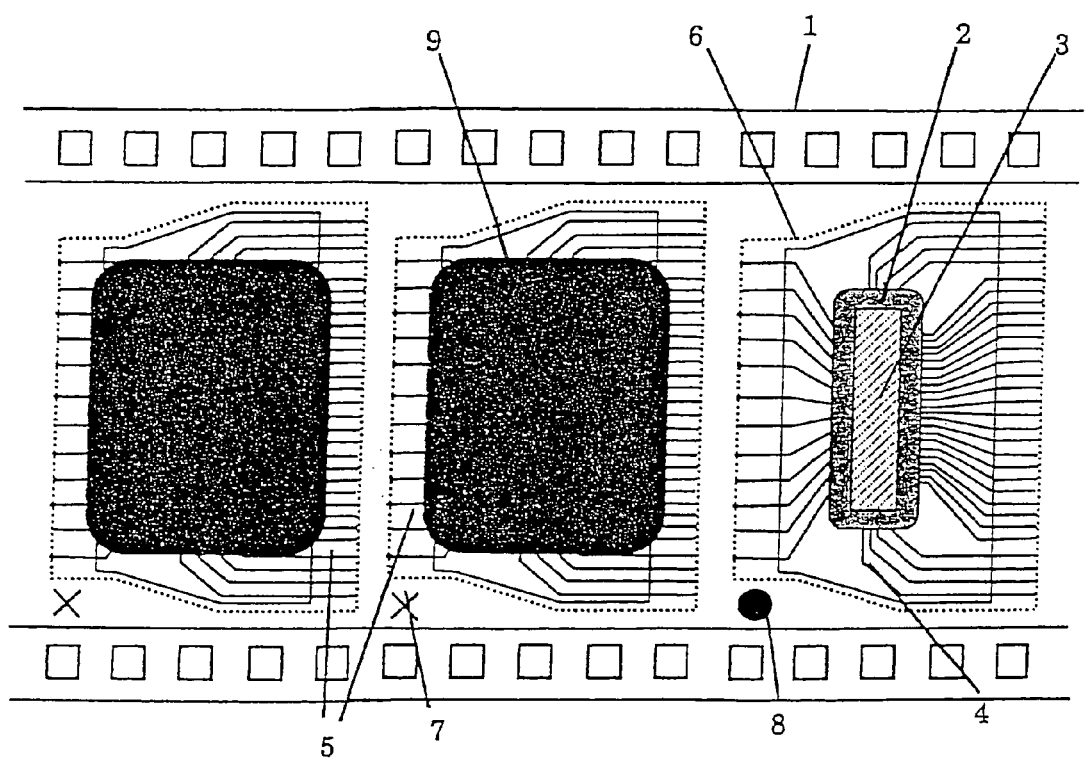
FIG. 3 is a plan view illustrating a state of a prior art tape carrier type semiconductor device (wherein one non-defective is arranged on the right and two defectives are arranged on the left) before die-cutting into pieced.
Figure 4:
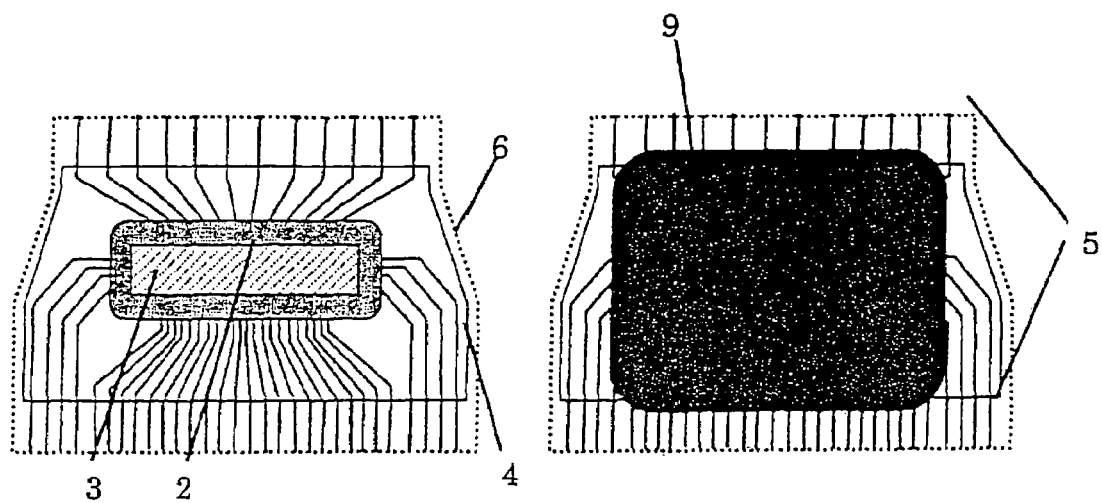
FIG. 4 is a plan view illustrating a state of the prior art tape carrier type semiconductor device (wherein a non-defective is arranged on the right and a defective is arranged on the left) after die-cutting into pieces.

FIGS. 1 and 2 illustrate an embodiment of a COF tape as a tape carrier type semiconductor device of the present invention.

As shown in FIG. 1, inside a predetermined region enclosed by a die-cutting outline 6 of a COF arranged on a COF tape, a hole for indicating the COF is a non-defective is bored through the tape. The hole 8 has a diameter of 0.5 mm to 3.0 mm. For a defective, a target mark 7 for indicating that the COF is a defective is bored in the tape. The target mark 7 is not bored through the tape. The hole 8 and target mark 7 serve to identify each COF as a non-defective or a defective.

A tape material used for this COF tape includes a polyimide-based insulating material having a thickness of 5 μm to 40 μm and a copper foil pattern having a thickness of 5 μm to 12 μm. The copper foil pattern is formed on the insulating material with no adhesive therebetween. The copper foil pattern may be plated with tin or gold upon requirement.

An external electrode of a semiconductor element 2 is provided with a projected electrode called a bump.

Namely, a surface of a semiconductor element 2 on which the external electrode is formed is aligned with an inner lead of a tape carrier 1 so that the electrode-formed surface is opposed to the inner lead. Then, the electrode-formed surface of the semiconductor element 2 and the inner lead are heated from a surface of the tape carrier 1 opposite to the inner lead. Next, the electrode-formed surface and the inner lead are thermocompression-bonded together by an inner lead bonding tool from the surface of the tape carrier 1 opposite to the inner lead. Thus, the bump (projected electrode) of the semiconductor element 2 is joined to the inner lead of the tape carrier 1.

After the semiconductor element 2 is joined to the tape carrier 1, an underfill resin is injected into a gap between the semiconductor element 2 and the tape carrier 1 to improve a humidity resistance and a mechanical strength of the tape carrier 1.

An insulating material called a solder resist is applied onto portions of the tape carrier 1 other than an external output terminal (outer lead) 5 thereof to form regions 4 covered with solder resist. The regions 4 covered with the solder resist serve to prevent shorts caused by the existence of a conductive foreign material directly on the pattern.

The completed COF in the form of a long tape is tested using a tester to determine sequentially whether each of the COFs arranged on the tape carrier 1 is a non-defective or a defective. The test is conducted while standing a probe needle in the outer lead 5 of the tape carrier 1 to check the COFs for their electrical behaviors.

For a COF determined to be a non-defective by this test, the hole 8 is bored with a die through the tape carrier 1 at the target mark 7 inside the region enclosed by the outline 6 of the COF. The target mark 7 only shows where the boring should be made with the die, and the shape of the target mark 7 is not particularly limited (In this embodiment, the target mark 7 is a × mark).

Simultaneously with the formation of a wiring pattern, the target mark is formed with use of a copper foil inside the region enclosed by the outline 6 of a COF. The target mark is subjected to a plating treatment in the same manner as the wiring pattern. The target mark may have a size of 0.5 mm×0.5 mm to 3.0 mm×3.0 mm.

The target mark has a surface plated with tin or gold for the reason as follows. That is, on the fact that the polyimide-based tape material is of a yellowish brown color, the target mark of a copper foil color is difficult to distinguish from the tape because the copper foil color is close to the yellowish brown color, whereas the target mark with a tin- or gold-plated surface is easy to distinguish. Also, in the case where a COF arranged on the COF tape is a non-defective, the 8 is bored through the tape at the target mark so that it can be clearly discerned even through visual observation that the semiconductor device is a non-defective.

For a COF determined to be a defective by the test, a retest (retest for a lot, reel or the like a percent defective of which is low) is conducted upon necessity to bring back a COF which is handled as a defective for reasons not derived from improper practices in the production of the semiconductor element 2 or COF such as poor connection of a probe needle.

For a COF determined to be a non-defective, the hole 8 is punched out by an additional treatment. Thereafter, the COF tape undergoes an appearance inspection and then is shipped.

The received COF as the tape carrier 1 (in the form of a reel) is die-cut sequentially into pieces. Then, only defectives having the hole 8 are selected and then are each mounted on a connection terminal of a product where an outer lead similar to the outer lead 5 employed in the tape carrier 1 is formed.

According to the tape carrier type semiconductor device of the present invention, unlike prior art tape carrier type semiconductor devices, the large holes to remove large portions each having a semiconductor element at the center are not punched out. The large holes could cause deformation in the semiconductor device to make the transfer of the tape unstable and thereby could cause failure in die-cutting into pieces. Therefore, according to the tape carrier type semiconductor device of the present invention where the large holes are absent, it is possible to prevent failure in die-cutting into pieces.

Also, according to the tape carrier type semiconductor device of the present invention, each semiconductor device arranged on the tape has, inside the predetermined region enclosed by the outline of the semiconductor device, either the hole for indicating that the semiconductor device is a non-defective or the target mark for indicating that the semiconductor device is a defective. Therefore, it is possible to easily identify each piece as a non-defective or a defective only through visual observation regardless of whether the identification is made before or after the die-cutting into pieces without using special devices including a photo sensor as employed in prior art tape carrier semiconductor devices.

What is claimed is:

1. A method of producing a tape carrier type semiconductor device, comprising the steps of:

arranging a plurality of semiconductor devices sequentially on one surface of a long flexible insulating tape;

forming either a hole or a target mark inside a predetermined region enclosed by an outline of each semiconductor device, the outline being for die-cutting into pieces, the hole being bored through the tape for indicating that the semiconductor device is non-defective, the target mark not being bored through the tape for indicating that the semiconductor device is defective; and conducting a test using a tester to determine sequentially whether each of the plurality of semiconductor devices arranged on the surface is a non-defective or a defective.

2. The method of claim 1, further comprising the step of die-cutting the plurality of semiconductor devices sequentially into pieces.

* * * * *